United States Patent
Watanabe et al.

(10) Patent No.: US 11,239,059 B2
(45) Date of Patent: Feb. 1, 2022

(54) ACTIVE GAS GENERATION APPARATUS

(71) Applicant: Toshiba Mitsubishi-Electric Industrial Systems Corporation, Tokyo (JP)

(72) Inventors: Kensuke Watanabe, Tokyo (JP); Shinichi Nishimura, Tokyo (JP); Ren Arita, Tokyo (JP); Yoshihito Yamada, Tokyo (JP); Yoichiro Tabata, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 0 days.

(21) Appl. No.: 16/764,898

(22) PCT Filed: Jan. 10, 2018

(86) PCT No.: PCT/JP2018/000254
§ 371 (c)(1),
(2) Date: May 18, 2020

(87) PCT Pub. No.: WO2019/138456
PCT Pub. Date: Jul. 18, 2019

(65) Prior Publication Data
US 2020/0343078 A1   Oct. 29, 2020

(51) Int. Cl.
*H01J 37/32*   (2006.01)
*C23C 16/452*   (2006.01)
(Continued)

(52) U.S. Cl.
CPC ...... *H01J 37/32568* (2013.01); *C23C 16/452* (2013.01); *C23C 16/455* (2013.01);
(Continued)

(58) Field of Classification Search
CPC ..... C23C 16/452; C23C 16/50; C23C 16/455; H05H 1/30; H05H 1/24; H01J 37/32082; H01J 37/32568; H01J 37/32348; H01J 37/3244; H01J 2237/332; H01J 2237/002; B01J 19/08
See application file for complete search history.

(56) References Cited

FOREIGN PATENT DOCUMENTS

| JP | 5328685 B2 | 10/2013 |
|----|-----------|---------|
| JP | 5694543 B2 | 4/2015  |

OTHER PUBLICATIONS

International Search Report and Written Opinion dated Apr. 10, 2018 for PCT/JP2018/000254 filed on Jan. 10, 2018, 9 pages including English Translation of the International Search Report.

*Primary Examiner* — Yuechuan Yu
(74) *Attorney, Agent, or Firm* — Xsensus LLP

(57) ABSTRACT

The present invention has features (1) to (3). The feature (1) is that "an active gas generation electrode group is formed in such a manner that a ground side electrode component supports a high-voltage side electrode component". The feature (2) is that "stepped parts are provided in a discharge space outside region of a dielectric electrode in the high-voltage side electrode component, and project downward, and by a formation height of these stepped parts, the gap length of a discharge space is defined". The feature (3) is that "the high-voltage side electrode component and the ground side electrode component are formed to have the thickness of a discharge space formation region relatively thin and the thickness of a discharge space outside region relatively thick".

4 Claims, 5 Drawing Sheets

(51) Int. Cl.
*C23C 16/455* (2006.01)
*C23C 16/50* (2006.01)
(52) U.S. Cl.
CPC .......... *C23C 16/50* (2013.01); *H01J 37/3244* (2013.01); *H01J 37/32082* (2013.01); *H01J 37/32348* (2013.01); *H01J 2237/002* (2013.01); *H01J 2237/332* (2013.01)

F I G. 1
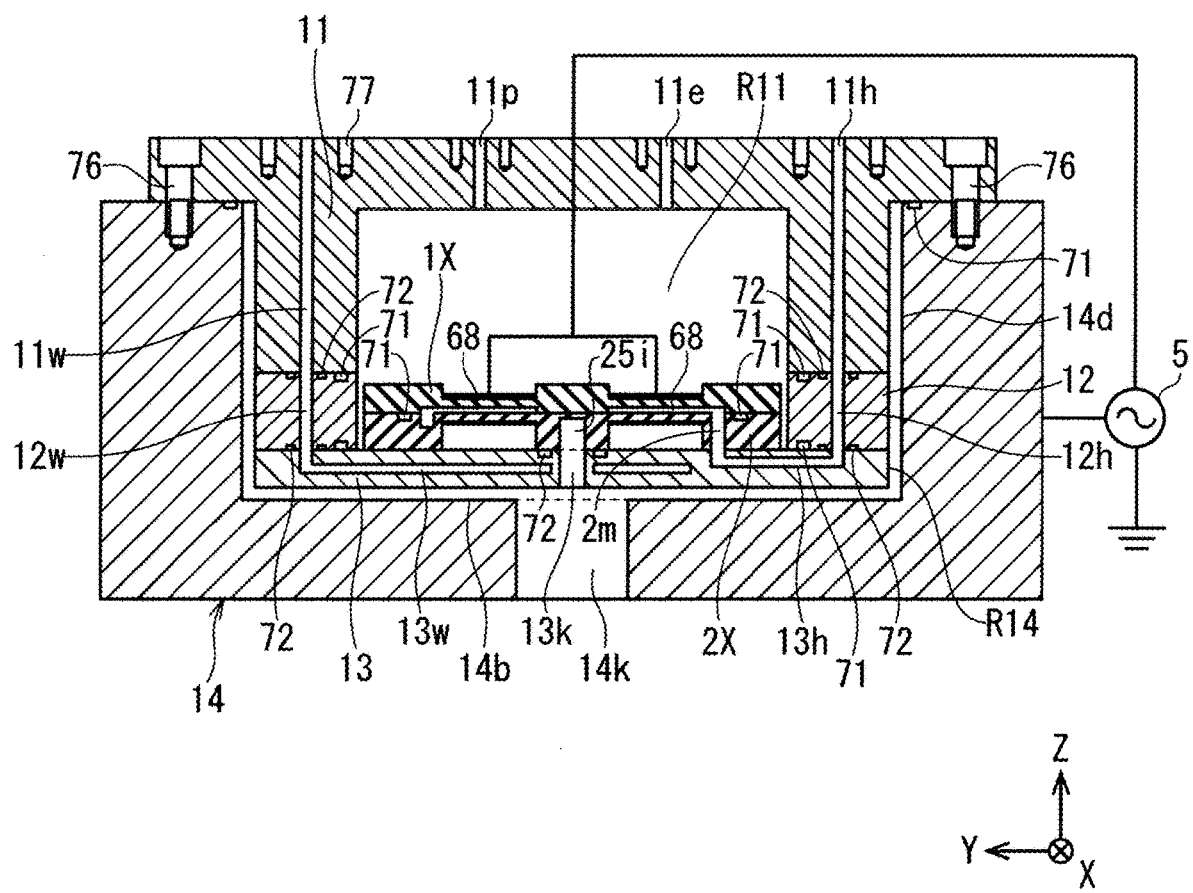

F I G. 4
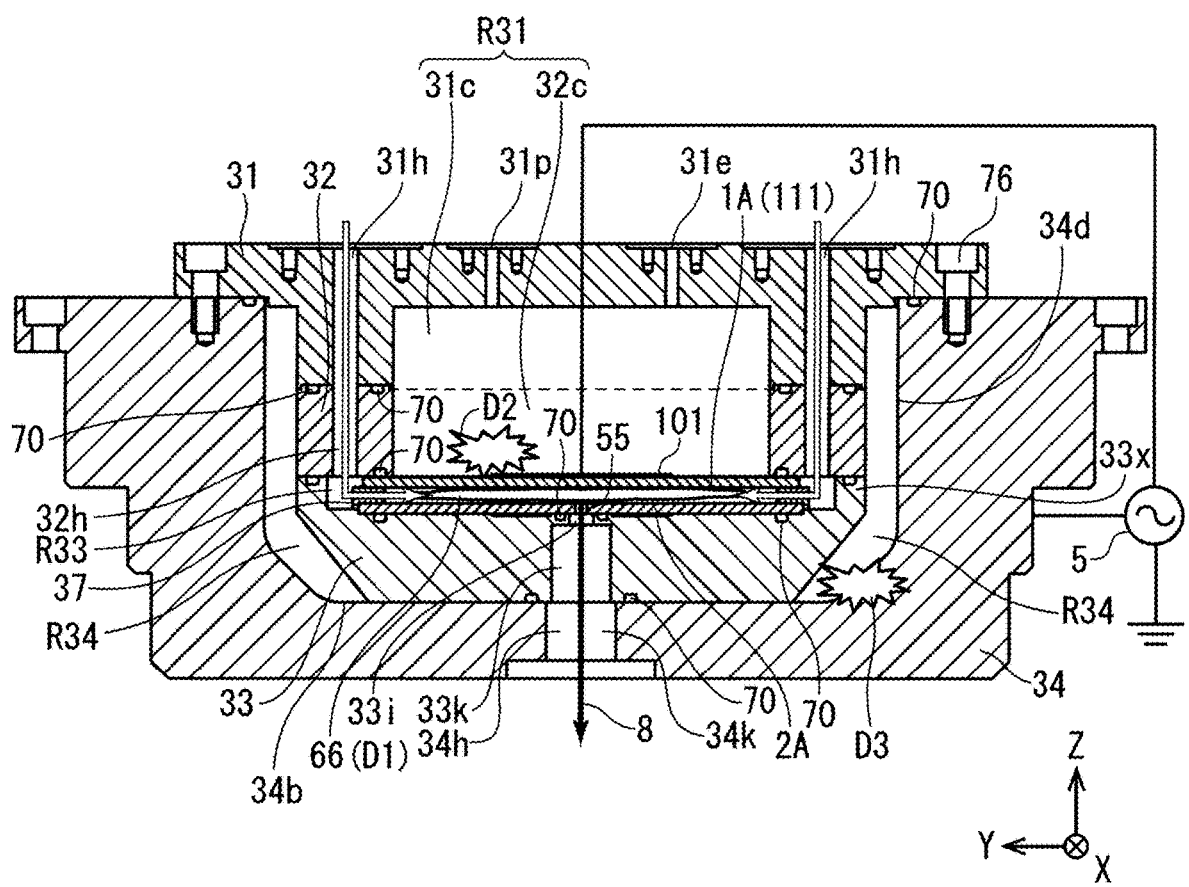

ACTIVE GAS GENERATION APPARATUS

CROSS-REFERENCE TO RELATED APPLICATION

The present application is based on PCT filing PCT/JP2018/000254, filed Jan. 10, 2018, the entire contents of which are incorporated herein by reference.

TECHNICAL FIELD

The present invention relates to an active gas generation apparatus including two electrodes installed in parallel to obtain active gas through energy of discharge caused by applying high voltage between the electrodes.

BACKGROUND ART

In an active gas generation apparatus including two electrodes installed in parallel to obtain active gas through the energy of a discharge phenomenon caused in a discharge space between the electrodes by applying high voltage between the electrodes, typically, alternating-current high voltage is applied to one of the electrodes, and the other electrode is set to a reference voltage such as a ground level.

In such an active gas generation apparatus, a high voltage of several kVrms (root mean square) is applied to one of electrodes as a high voltage power supply part. In a space other than the discharge space formed between the pair of electrodes, the distance between the power supply part and a ground part (the other electrode and any component place electrically connected therewith) is sufficiently provided to prevent insulation breakdown of gas in the space. However, from a microscopic viewpoint, it is impossible to avoid concentration of electric field intensity enough to cause insulation breakdown of a surrounding gas layer due to the shape and surface state of a metal component of the power supply part.

When insulation breakdown occurs in a space other than the discharge space, a phenomenon that causes evaporation of the constituent element of any component nearby occurs. When the nearby component is made of metal, the above-described phenomenon causes metal contamination in a semiconductor deposition process.

Examples of active gas generation apparatuses developed with such metal contamination taken into consideration include a plasma generation apparatus disclosed in Patent Document 1 and a plasma processing apparatus disclosed in Patent Document 2.

The plasma generation apparatus disclosed in Patent Document 1 performs dielectric barrier discharge at a discharge part provided between a high-voltage side electrode component and a ground side electrode component facing each other, and generates active gas by causing material gas to pass through the discharge part. In this apparatus, the discharge part and an alternating-current voltage application part are not separated from each other but exist in an identical space. After having passed through the alternating-current voltage application part, the material gas is supplied to the discharge space and finally to a processing chamber.

The plasma processing apparatus disclosed in Patent Document 2 employs a structure in which insulators are inserted and sealed at outer edge parts of electrode components facing each other. This structure is intended to prevent anomalous discharge from a discharge part to a housing (including a ground electrode) in which the electrode components are installed.

PRIOR ART DOCUMENTS

Patent Documents

Patent Document 1:Japanese Patent No. 5694543
Patent Document 2:Japanese Patent No. 5328685 (FIG. 10)

SUMMARY

Problem to be Solved by the Invention

However, in the plasma generation apparatus disclosed in Patent Document 1, discharge due to insulation breakdown of the material gas does not necessarily occur only at the discharge part. From a macroscopic viewpoint, it is designed to provide a sufficient insulation distance to prevent unnecessary discharge at a place other than the discharge part. Examples of such unnecessary discharge include anomalous discharge between a metal electrode of the high-voltage side electrode component through which alternating-current voltage is applied and a metal housing that houses the electrode component.

However, from a microscopic viewpoint, irregularities are inevitably formed on the surface of a current introduction terminal through which alternating-current voltage is applied and the surface of any metal component or the like connected therewith. It is extremely difficult to eliminate the probability that strong electric field regions are formed around some convex portions of the irregularities, and as a result, gas insulation breakdown, in other words, anomalous discharge occurs.

Thus, the plasma generation apparatus disclosed in Patent Document 1 has such a problem that the above-described insulation breakdown causes evaporation of any constituent element installed nearby, and the evaporated constituent element is mixed into the material gas and supplied to the discharge part and the processing chamber, which causes semiconductor metal contamination.

The plasma processing apparatus disclosed in Patent Document 2 is insufficient to prevent metal contamination mixture when anomalous discharge occurs. This is because the discharge part and the alternating-current voltage application part still exist in an identical space, and the material gas having passed through the alternating-current voltage application part proceeds to the discharge part and generates active gas, which is the same structural problem. Specifically, similarly to the plasma generation apparatus disclosed in Patent Document 1, the plasma processing apparatus disclosed in Patent Document 2 cannot avoid generation of metal contamination, and accordingly has the problem of degradation of the quality of generated active gas.

The present invention is intended to solve the problems as described above and provide an active gas generation apparatus capable of generating high quality active gas.

Means to Solve the Problem

An active gas generation apparatus according to the present invention comprises an active gas generation electrode group including a first electrode component and a second electrode component provided below the first electrode component and an alternating-current power source unit configured to apply alternating-current voltage to the first and second electrode components so that the first electrode component is at high voltage, the first electrode component including a first dielectric electrode and a first metal electrode formed on an upper surface of the first dielectric electrode, the second electrode component including a second dielectric electrode and a second metal electrode formed on a lower surface of the second dielectric electrode, a discharge space formation region in which the first and second metal electrodes overlap with each other in plan view being included as a discharge space in a dielectric space across which the first and second dielectric electrodes face each other, application of the alternating-current voltage by the alternating-current power source unit causing a discharge phenomenon in the discharge space, active gas obtained by activating material gas supplied to the discharge space being ejected through a gas ejection port provided in the second electrode component, said active gas generation apparatus further comprises a first auxiliary member provided surrounding a side surface and an upper surface of the active gas generation electrode group, a second auxiliary member having a main surface of an upper part on which the active gas generation electrode group and the first auxiliary member are arranged, an alternating-current voltage application space being separated from the discharge space being provided between the active gas generation electrode group and each of the first and second auxiliary members, the second auxiliary member including an auxiliary member gas discharge port through which active gas ejected from the gas ejection port passes, the first and second auxiliary members being integrally coupled, said active gas generation apparatus further comprises a housing of metal including a hollow space part that houses all of the active gas generation electrode group and the second auxiliary member and at least part of the first auxiliary member, the housing including a housing gas discharge port through which the active gas passing through the auxiliary member gas discharge port is discharged to the outside, a housing contact space being provided between the housing and each of the first and second auxiliary members. The first and second auxiliary members include a material gas flow path for a material gas supply path, through which externally supplied material gas is guided to the discharge space, independently from the alternating-current voltage application space so that gas flow in the discharge space and gas flow in the alternating-current voltage application space are separated from each other. The active gas generation apparatus has features (1) to (5) below: (1) the active gas generation electrode group is formed in a manner in which the second electrode component supports the first electrode component, (2) the first dielectric electrode includes a stepped part projecting downward in a discharge space outside region that is other than the discharge space formation region, and a gap length of the discharge space is defined by a formation height of the stepped part, (3) a thickness of the discharge space formation region of each of the first and second dielectric electrodes is made thinner than that of the discharge space outside region, (4) the housing is fastened to the first auxiliary member only in an upper surface outside the hollow space part to form the housing contact space in the hollow space part without contacting a side surface of the first auxiliary member and a bottom surface of the second auxiliary member, and (5) all of the first and second auxiliary members are formed of metal material.

Effects of the Invention

In an active gas generation apparatus as the present application invention according to claim 1, an alternating-current voltage application space is provided separately from a discharge space, and first and second auxiliary members include a material gas flow path for a material gas supply path, through which externally supplied material gas is guided to the discharge space, independently from the alternating-current voltage application space so that gas flow in the discharge space and gas flow in the alternating-current voltage application space are separated from each other.

Thus, it is possible to reliably avoid a mixing phenomenon in which an evaporation material, such as the material of a first electrode component, generated when anomalous discharge occurs in the alternating-current voltage application space is mixed into the discharge space directly or through the material gas supply path.

As a result, the active gas generation apparatus as the present application invention according to claim 1 can reliably avoid the mixing phenomenon described above and discharge high quality active gas to the outside.

Since the present application invention according to claim 1 has the above-mentioned feature (1), the first and second electrode components have a structure in which misalignment is unlikely to occur, so that possibility of occurrence of anomalous discharge in a gap caused by misalignment can be reduced.

Since the present application invention according to claim 1 has the above-mentioned feature (2), the gap length can be set with high accuracy, and further, other parts such as a spacer for forming the gap length are unnecessary so that product costs can be reduced.

Since the present application invention according to claim 1 has the above-mentioned feature (3), an increase in applied voltage for causing the discharge phenomenon in the discharge space can be avoided, and the possibility of occurrence of anomalous discharge can be reduced. Furthermore, by increasing the thickness of the discharge space outside region in each of the first and second dielectric electrodes, the strength of the first and second electrode components can be improved.

Since the present application invention according to claim 1 has the above-mentioned feature (4), sealing between the housing and the first auxiliary member can be completed at one place on the upper surface of the housing, so that the design shape can have room.

Since the present application invention according to claim 1 has the above-mentioned feature (5), dielectric breakdown due to gas present in the housing contact space provided between the housing and each of the first and second auxiliary members can be effectively prevented.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is an explanatory diagram schematically illustrating a sectional structure of an active gas generation apparatus according to an embodiment of the present invention.

FIG. 4 is an explanatory diagram schematically illustrating a cross-sectional structure of an active gas generation apparatus of a basic art.

DESCRIPTION OF EMBODIMENT

<Outline of Active Gas Generation Apparatus>

The following describes particulars of an active gas generation apparatus common to embodiments described below. An active gas generation electrode group of dielectric barrier discharge is formed by opposingly disposing a pair of a high-voltage side electrode component and a ground side electrode component. In the active gas generation electrode group, a discharge space is formed between the high-voltage side electrode component and the ground side electrode component.

The active gas generation electrode group is housed in a metallic housing, and the active gas generation apparatus including the active gas generation electrode group and the housing is disposed right above a processing chamber in which a silicon wafer is subjected to deposition. A metal electrode is metallized on part of the surface of a dielectric electrode in each of the high-voltage side electrode component and the ground side electrode component so that the dielectric electrode and the metal electrode are integrally formed. The metallization is performed by a print burning method, a sputtering process, a vapor deposition process, or the like.

The metal electrode is connected with a high frequency power source. The ground side electrode component is grounded together with the housing, and fixed to a reference potential. Dielectric barrier discharge is caused in the discharge space of the active gas generation electrode group by applying an AC voltage V0p (zero peak value) of 10 kHz to 100 kHz and 2 kV to 10 kV to the active gas generation electrode group from the high frequency power source.

The active gas generation apparatus is supplied with material gas of nitrogen, oxygen, rare gases, hydrogen, fluorine, and the like from the outside through a gas supply port (material gas flow path). The material gas flows to the discharge space inside, through a material gas supply path provided at an outer peripheral part of the active gas generation electrode group, and is activated in the discharge space. Gas containing this active gas is ejected through a gas ejection port provided at the ground side electrode component to the processing chamber outside the housing, and performs deposition.

<Basic Art>

FIG. 4 is an explanatory diagram schematically illustrating a cross-sectional structure of an active gas generation apparatus of a basic art of the present invention. FIGS. 5A to 5D are explanatory diagrams illustrating a main configuration part of the active gas generation apparatus of a basic art in a disassembled state. Note that FIGS. 4 and 5A to 5D each illustrate an XYZ orthogonal coordinate system.

Figure 5A:
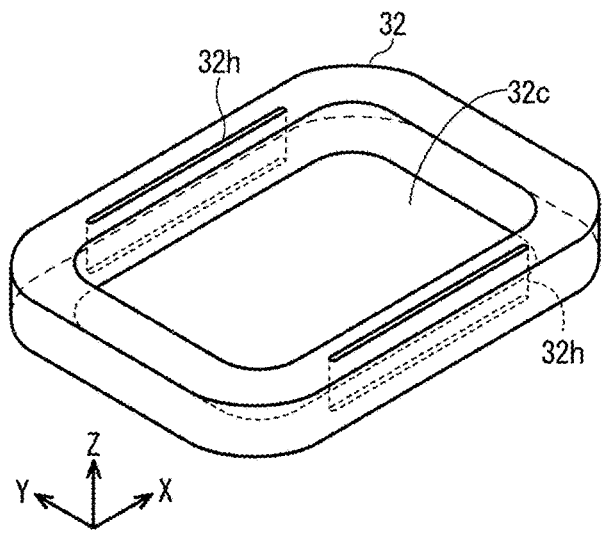
FIGS. 5A to 5D are explanatory diagrams illustrating a main configuration part of the active gas generation apparatus of a basic art in a disassembled state.
Figure 5C:
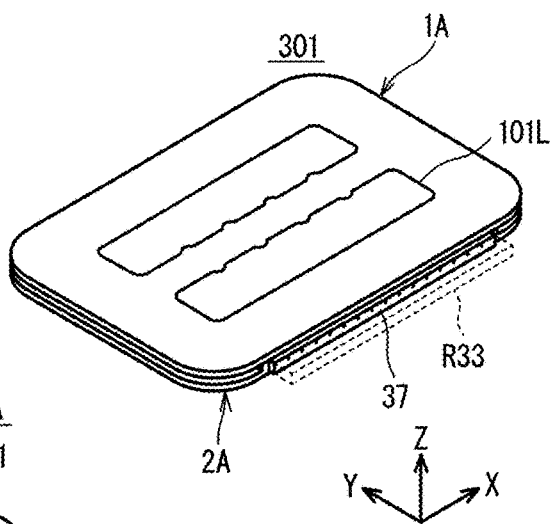
Figure 5B:
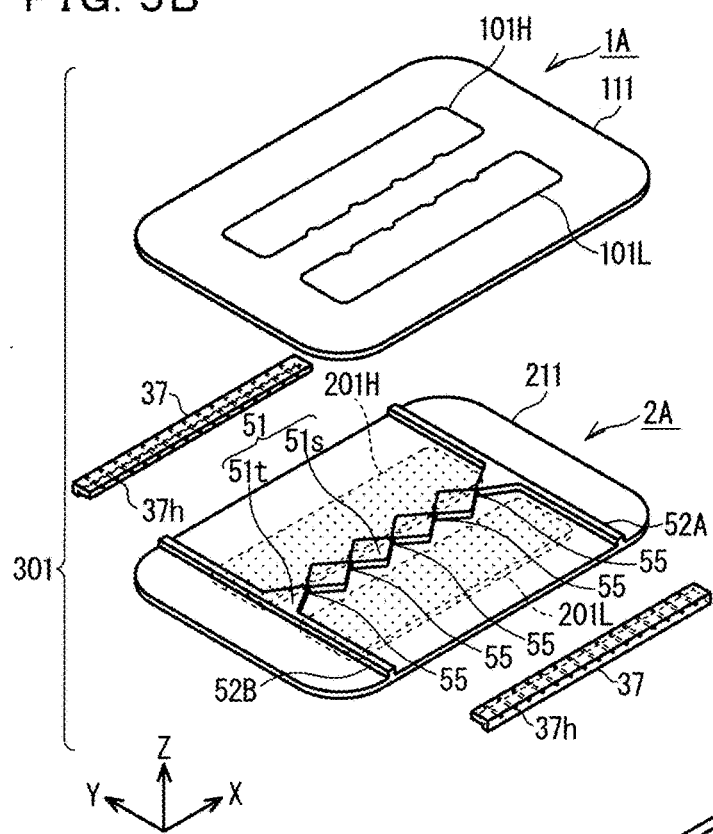

As illustrated in FIG. 5B and FIG. 5C, an active gas generation electrode group 301 includes a high-voltage side electrode component 1A (first electrode component) and a ground side electrode component 2A (second electrode component) provided below the high-voltage side electrode component 1A.

The ground side electrode component 2A includes a dielectric electrode 211 and metal electrodes 201H and 201L, and the dielectric electrode 211 has a rectangular flat plate structure having a longitudinal direction along the X direction and a transverse direction along the Y direction.

A plurality of gas ejection ports 55 are provided in the X direction at the center of the dielectric electrode 211. The plurality of gas ejection ports 55 penetrate from the upper surface to the lower surface of the dielectric electrode 211.

In addition, a wedge-shaped stepped part 51 is formed not to overlap with the plurality of gas ejection ports 55 in plan view but to have a shorter formation width in the Y direction at a position closer to each of the plurality of gas ejection ports 55 in plan view. Specifically, the wedge-shaped stepped part 51 is formed as an assembly of four rhombus singular parts 51s each formed in a rhombic shape in plan view between the five gas ejection ports 55 and separated from each other, and two triangle singular parts 51t provided outside the gas ejection ports 55 at both ends among the five gas ejection ports 55 and each formed in a substantially isosceles triangular shape in plan view.

The dielectric electrode 211 further includes straight stepped parts 52A and 52B formed protruding upward at both end sides in the X direction. The straight stepped parts 52A and 52B extends in the Y direction over the total length of the dielectric electrode 211 in the transverse direction in plan view, and the gap length of a discharge space 66 is defined by the formation heights of the straight stepped parts 52A and 52B together with the formation height of the wedge-shaped stepped part 51.

As illustrated in FIG. 5B, the metal electrodes 201H and 201L are formed on the lower surface of the dielectric electrode 211, and disposed facing each other with a central region of the dielectric electrode 211 interposed therebetween in plan view. The metal electrodes 201H and 201L each have a substantially rectangular shape in plan view, and have a longitudinal direction along the X direction and a mutually facing direction along the Y direction orthogonal to the X direction.

The metal electrodes 201H and 201L are metallized on the lower surface of the dielectric electrode 211, and as a result, integrally formed with the dielectric electrode 211, constituting the ground side electrode component 2A. The metallization is performed by, for example, a print burning method, a sputtering process, and an evaporation process.

Similarly to the dielectric electrode 211, a dielectric electrode 111 of the high-voltage side electrode component 1A has a rectangular flat plate structure having a longitudinal direction along the X direction and a transverse direction along the Y direction. The dielectric electrode 111 and the dielectric electrode 211 are made of, for example, ceramic.

Metal electrodes 101H and 101L are formed on the upper surface of the dielectric electrode 111 and disposed facing each other in plan view with, interposed therebetween, a central region in the same shape corresponding to the central region of the dielectric electrode 211. Similarly to the metal electrodes 201H and 201L, the metal electrodes 101H and 101L each have a substantially rectangular shape in plan view, and have a longitudinal direction along the X direction and a mutually facing direction along the Y direction orthogonal to the X direction. Similarly to the metal electrodes 201H and 201L, the metal electrodes 101H and 101L can be formed on the upper surface of the dielectric electrode 111 by metallization.

As illustrated in FIG. 5C, the active gas generation electrode group 301 can be assembled by disposing the high-voltage side electrode component 1A on the ground side electrode component 2A. In this case, the high-voltage side electrode component 1A is stacked and combined on the ground side electrode component 2A while the central region of the dielectric electrode 111 in the high-voltage side electrode component 1A and the central region of the dielectric electrode 211 in the ground side electrode component 2A are positioned to overlap with each other in plan view. This can finally complete the active gas generation electrode group 301.

A pair of spacers 37 are provided between the straight stepped parts 52A and 52B on both side surfaces extending in the X direction in the active gas generation electrode group 301. The pair of spacers 37 are provided between the high-voltage side electrode component 1A and the ground side electrode component 2A, and the formation heights thereof define the gap length of the discharge space 66 together with the wedge-shaped stepped part 51 and the straight stepped parts 52A and 52B described above. The spacers 37 are made of a non-metallic material, and desirably made of the same material as that of the dielectric electrodes 111 and 211.

In addition, the pair of spacers 37 are each provided with a plurality of through-holes 37h extending in the Y direction so that material gas can be supplied from outside of the active gas generation electrode group 301 into the discharge space 66 between the high-voltage side electrode component 1A and the ground side electrode component 2A through the plurality of through-holes 37h.

The discharge space is defined to be a region in which the metal electrodes 101H and 101L overlap with the metal electrodes 201H and 201L in plan view in a dielectric space across which the dielectric electrode 111 and the dielectric electrode 211 included in the active gas generation electrode group 301 face each other.

The metal electrodes 101H and 101L and the metal electrodes 201H and 201L are connected with a (high-voltage) high frequency power source 5 (alternating-current power source unit). Specifically, the metal electrodes 201H and 201L of the ground side electrode component 2A are grounded through a metal component (not illustrated) selectively provided inside a metal housing 34 and an electrode component installation table 33, and in the present embodiment, an alternating-current voltage having a zero peak value fixed to 2 kV to 10 kV and a frequency set to be 10 kHz to 100 kHz is applied between each of the metal electrodes 101H and 101L and the corresponding one of the metal electrodes 201H and 201L from the high frequency power source 5. The electrode component installation table 33 except for the above-described metal component is made of an insulating material, for example, ceramic. The above-described metal component may be installed such that, for example, like an active gas discharge port 33k to be described later, a plurality of through-holes vertically penetrating through the electrode component installation table 33 are provided, and the above-described metal component is provided in each of the plurality of through-holes to electrically connect the metal electrodes 201H and 201L of the ground side electrode component 2A to a metal housing 34.

As illustrated in FIG. 4, in the active gas generation apparatus according to the basic art, the active gas generation electrode group 301 (including the high-voltage side electrode component 1A and the ground side electrode component 2A) having the above-described configuration is housed in the metal housing 34 by using a cover 31, a cover 32, and the electrode component installation table 33.

As described above, the high frequency power source 5 (alternating-current power source unit) configured to apply alternating-current voltage so that the high-voltage side electrode component 1A is at a high voltage relative to the active gas generation electrode group 301 is provided. Through the alternating-current voltage application by the high frequency power source 5, the discharge space 66 is formed between the high-voltage side electrode component 1A and the ground side electrode component 2A, and active gas obtained by activating the material gas supplied to the discharge space 66 is ejected downward through the plurality of gas ejection ports 55 provided in the ground side electrode component 2A.

A first auxiliary member formed by combining the covers 31 and 32 is provided above the high-voltage side electrode component 1A to form, together with the high-voltage side electrode component 1A, an alternating-current voltage application space R31 separated from the discharge space 66.

The electrode component installation table 33 as a second auxiliary member has a main surface 33b (refer to FIG. 5D) on which the entire lower surface of the ground side electrode component 2A is disposed to support the active gas generation electrode group 301 from the ground side electrode component 2A side. The outer peripheral part of the electrode component installation table 33 includes an outer peripheral protrusion part 33x protruding upward (+Z direction) from the main surface 33b, and the outer peripheral protrusion part 33x surrounds the entire active gas generation electrode group 301 to form a side surface space R33 (refer to FIG. 4 and FIG. 5C) between the outer peripheral protrusion part 33x and the spacers 37.

Figure 5D:
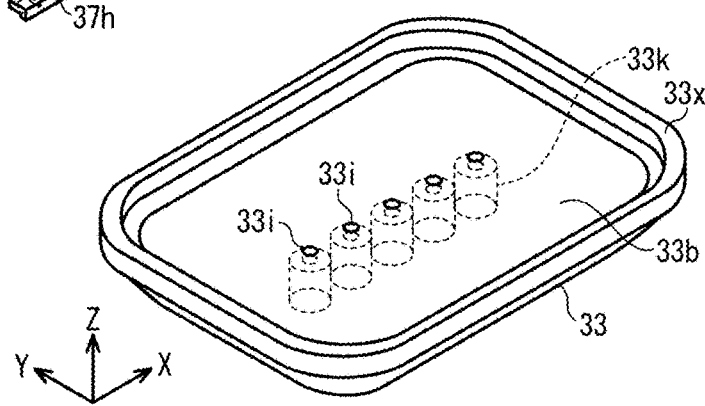

As illustrated in FIG. 4 and FIG. 5D, the electrode component installation table 33 includes a plurality of active gas passing ports 33i and a plurality of active gas discharge ports 33k through which the active gas ejected from the plurality of gas ejection ports 55 passes and is guided downward. The plurality of active gas passing ports 33i are disposed to coincide with the plurality of gas ejection ports 55 in plan view, and the plurality of active gas discharge ports 33k are provided below the plurality of active gas passing ports 33i, respectively. A combination of each active gas passing port 33i and the corresponding active gas discharge ports 33k forms an auxiliary member gas discharge port through which the active gas ejected from the corresponding gas ejection port 55 passes.

As illustrated in FIG. 5A, the cover 32 as part of the first auxiliary member is constituted in a rectangular annular shape in plan view and disposed on an end part of the high-voltage side electrode component 1A and the outer peripheral protrusion part 33x of the electrode component installation table 33. A hollow region 32c as an inner periphery region of the cover 32 is smaller than the shape of the high-voltage side electrode component 1A in plan view, and disposed on the high-voltage side electrode component 1A and within the high-voltage side electrode component 1A. An outer peripheral region of the electrode component installation table 33 is larger than the high-voltage side electrode component 1A in plan view, and disposed including the entire high-voltage side electrode component 1A.

In addition, as illustrated in FIG. 4 and FIG. 5A, the cover 32 includes a material gas flow path 32h penetrating through the cover 32 in the vertical direction (Z direction). The material gas flow path 32h linearly extends in the X direction at a central part in a long side region of the cover 32 extending in the X direction. The side surface space R33 is positioned below the material gas flow path 32h.

In addition, the cover 31 is disposed on the cover 32. The cover 31 has a lower part formed in a rectangular annular shape identical to that of the cover 32 in plan view, and an upper part formed in a rectangular shape in plan view, an end part of the upper part being disposed on the upper surface of the metal housing 34. A hollow region 31c as an inner periphery region of the cover 31 has a shape identical to that of the hollow region 32c of the cover 32 in plan view. The end part of the upper part of the cover 31 is fixed to the upper surface of the metal housing 34 by using fixation means such as a bolt.

As illustrated in FIG. 4, the cover 31 includes a vertically penetrating material gas flow path 31h formed in a cylindrical shape, and part of the material gas flow path 32h is positioned below the material gas flow path 31h. Similarly to the material gas flow path 32h, the material gas flow path 31h may be linearly formed extending in the X direction at a central part in a long side region of the cover 31 extending in the X direction so that the entire material gas flow path 32h is positioned below the material gas flow path 31h.

In addition, the cover 31 includes, at the upper part, a vertically penetrating purge gas supply port 31p as a second gas supply port for purge gas as second gas other than the material gas, and a vertically penetrating purge gas discharge port 31e as a second gas discharge port. The purge gas supply port 31p and the purge gas discharge port 31e are each formed in a cylindrical shape. The purge gas supply port 31p and the purge gas discharge port 31e are each provided so that a lower part thereof reaches the hollow region 31c. The purge gas supply port 31p and the purge gas discharge port 31e are provided independently from the material gas flow path 31h to avoid mixture of the purge gas and the material gas. The purge gas supplied through the purge gas supply port 31p is nitrogen or inert gas. The purge gas supply port 31p and the purge gas discharge port 31e are also formed independently from the discharge space 66 and a housing contact space R34 to be described later.

The first auxiliary member as a combined structure of the covers 31 and 32 provides the alternating-current voltage application space R31 composed of the hollow region 31c of the cover 31 and the hollow region 32c of the cover 32 above the high-voltage side electrode component 1A.

Since the covers 31 and 32 are formed in rectangular annular shapes in plan view as described above, the alternating-current voltage application space R31 is an independent space completely separated from the other space by the high-voltage side electrode component 1A and the covers 31 and 32. The side surface space R33 is completely separated from the other space except for the discharge space 66 and the material gas flow paths 31h and 32h by a bottom surface of the cover 32, an end part region of the main surface 33b of the electrode component installation table 33, and the outer peripheral protrusion part 33x.

In addition, a material gas supply path connected with the discharge space 66 from the outside above the material gas flow path 31h is formed by the material gas flow path 31h, the material gas flow path 32h, the side surface space R33, and the plurality of through-holes 37h provided in the spacers 37. The material gas flow paths 31h and 32h are provided independently from the hollow regions 31c and 32c.

Thus, the material gas supply path guided to the discharge space 66 from above the material gas flow path 31h is formed independently from the alternating-current voltage application space R31 by the material gas flow paths 31h and 32h, the side surface space R33, and the plurality of through-holes 37h of the spacers 37.

As a result, the alternating-current voltage application space R31 and the discharge space 66 are not spatially connected with each other through the material gas supply path, and thus gas flow can be completely separated between the alternating-current voltage application space R31 and the discharge space 66.

The cover 32 is made of a non-metallic material. The cover 32 is desirably made of the same material as that of the dielectric electrodes 111 and 211 to handle any anomalous discharge occurring in the material gas flow path 32h. The cover 31 is made of a metallic material. The formation height of the cover 32 is set to provide a sufficient distance from the metal electrodes 101H and 101L as high-voltage application regions so that the cover 31 is installed in a region having a low electric field intensity.

Alternatively, the cover 32 may be made of an insulation material, such as quartz or silicon nitride, that is generated by the active gas and causes no problem inside the generation apparatus. In this case, no problem occurs to deposition when anomalous discharge occurs in the material gas supply path (for example, the cover 32 and the spacers 37) and a constituent element evaporates and mixes into the material gas.

In this manner, any metallic material is completely excluded from the material gas supply path provided at a position relatively close to the high-voltage side electrode component 1A as a strong electric field region, thereby preventing metal contamination due to the metal component.

The metal housing 34 houses, in an internal hollow space part, all of the active gas generation electrode group 301 (the high-voltage side electrode component 1A and the ground side electrode component 2A), the cover 32, and the electrode component installation table 33, and the lower part of the cover 31.

The electrode component installation table 33 is disposed on a bottom surface 34b of the hollow space part of the metal housing 34, and an active gas discharge port 34k (housing gas discharge port) is positioned below the active gas discharge ports 33k. With this configuration, the active gas ejected from the gas ejection ports 55 is ejected, along gas flow 8, to an external processing chamber provided below or the like through the active gas passing ports 33i, the active gas discharge ports 33k, and the active gas discharge port 34k.

The housing contact space R34 is provided between a side surface 34d of the hollow space part of the metal housing 34, and each of the electrode component installation table 33, the cover 32, and a side surface region at a lower part of the cover 31, and part of a bottom surface region of the upper part of the cover 31. In this manner, the housing contact space R34 is provided between the metal housing 34 and the outside of the covers 31 and 32 and the electrode component installation table 33. The housing contact space R34 is provided mainly to provide an insulation distance from the metal electrodes 101H and 101L of the active gas generation electrode group 301.

As described above, the alternating-current voltage application space R31 is an internal space completely independent from the other space by the high-voltage side electrode component 1A and the covers 31 and 32, and the discharge space 66 is an internal space independent from the other space except for the material gas supply path. With this configuration, the housing contact space R34 is separated from each of the alternating-current voltage application space R31 and the discharge space 66.

In addition, since the material gas flow paths 31h and 32h for the material gas supply path are provided independently from the housing contact space R34, the above-described material gas supply path reaching the discharge space 66 is an internal space independent from the other space, and accordingly, gas flow in the discharge space 66 is completely separated from gas flow in the housing contact space R34.

In this manner, the alternating-current voltage application space R31, the discharge space 66, and the material gas supply path including the material gas flow paths 31h and 32h are provided independently from the housing contact space R34 so that gas flow therein is separated from gas flow in the housing contact space R34.

An O-ring 70 is provided surrounding the material gas flow paths 31h and 32h at a contact surface between the cover 31 and the cover 32. Similarly, another O-ring 70 is provided surrounding the material gas flow path 32h and the side surface space R33 at a contact surface between the cover 32 and the electrode component installation table 33. These O-rings 70 increase the degree of sealing of the material gas supply path from the other space.

In addition, another O-ring 70 is provided surrounding the active gas passing ports 33i at a contact surface between the ground side electrode component 2A and the electrode component installation table 33, and another O-ring 70 is provided surrounding the active gas discharge ports 33k and 34k at a contact surface between the electrode component installation table 33 and the metal housing 34. These O-rings 70 increase the degrees of sealing of the active gas passing ports 33i, the active gas discharge ports 33k, and the active gas discharge port 34k from the other space. In FIG. 4, each O-ring 70 is illustrated with a small circle.

Hereinafter, effects of the active gas generation apparatus of the basic art will be described.

In the active gas generation apparatus of the basic art, the alternating-current voltage application space R31 is separated from the discharge space 66, and the first auxiliary member composed of the covers 31 and 32 includes the material gas flow paths 31h and 32h for the material gas supply path that guide externally supplied material gas to the discharge space 66 independently from the alternating-current voltage application space R31, thereby completely separating gas flow in the discharge space 66 from gas flow in the alternating-current voltage application space R31.

This can reliably avoid a first mixing phenomenon in which an evaporation material, such as the material of the high-voltage side electrode component 1A (the metal electrodes 101H and 101L, in particular), generated when anomalous discharge D2 occurs in the alternating-current voltage application space R31 is mixed into the discharge space 66 directly or through the material gas supply path.

In addition, in the active gas generation apparatus of the basic art, the housing contact space R34 is separated from the discharge space 66, and the first auxiliary member composed of the covers 31 and 32 includes the material gas flow paths 31h and 32h for the material gas supply path independently from the housing contact space R34, thereby completely separating gas flow in the discharge space 66 from gas flow in the housing contact space R34.

With this configuration, it is also possible to reliably avoid a second mixing phenomenon in which an evaporation material generated by anomalous discharge D3 or the like in the housing contact space R34 is mixed into the discharge space 66.

As a result, the active gas generation apparatus of the basic art can reliably avoid the first and second mixing phenomena described above and discharge high quality active gas to the outside.

In addition, in the active gas generation apparatus of the basic art, the purge gas as the second gas other than the material gas can be supplied into the alternating-current voltage application space R31 through the purge gas supply port 31p. Thus, any evaporation material generated when anomalous discharge occurs in the alternating-current voltage application space R31 can be removed to the outside through the purge gas discharge port 31e.

Since the above-described material gas supply path is provided independently from the alternating-current voltage application space R31, the material gas is not affected by the purge gas supply.

<Problem of Basic Art>

(First Problem)

Sealing is performed at two locations in the vertical direction between the cover 31, the cover 32, and the electrode component installation table 33 (hereinafter, may be abbreviated as "cover 31 and the like") and the metal housing 34.

Specifically, sealing between the cover 31 and the like and the metal housing 34 is performed by an O-ring 70 provided between the metal housing 34 and the cover 31 on the upper surface of the metal housing 34 and an O-ring 70 provided between the metal housing 34 and the electrode component installation table 33 on the bottom surface 34b of the hollow space part of the metal housing 34.

The vertical positioning of the cover 31 and the like must be performed at one of the two sealing locations by the O-ring 70, and in that case, it is necessary to provide a dimensional tolerance equal to or less than the compression allowance of the O-ring 70 in the other sealing location, so that a design shape is required to be extremely strict in a geometrical tolerance, a dimensional tolerance, or the like. As a result, there is a risk that the sealing cannot be reliably performed at the two sealing locations, or that the processing costs may increase.

(Second Problem)

All the fastening of the O-rings 70 illustrated in FIG. 4 are performed only by the fastening by a fastening mechanism 76 such as a bolt between the cover 31 and the metal housing 34. In this case, it is necessary to considerably increase the bolt axial force to the fastening mechanism 76 as a whole, thereby increasing the risk of damage to the electrode component installation table 33 and the cover 32, which are non-metallic components, and at the same time, causing a possibility that each O-ring 70 is not reliably sealed.

(Third Problem)

There is no mechanism for pressing the O-ring 70 near the center provided between the ground side electrode component 2A and the electrode component installation table 33 from directly above. In the case of the basic art, since the fastening force applied to the ground side electrode component 2A passes through the ground side electrode component 2A itself and presses the lower O-ring 70, there is a possibility that excessive bending strength occurs in the ground side electrode component 2A which increases the risk of damage, and the lower O-ring 70 cannot be reliably sealed.

(Fourth Problem)

Since the electrode component installation table 33 for supporting the active gas generation electrode group 301 from the ground side electrode component 2A side is provided as a separate component of the active gas generation electrode group 301, even when a slight gap is formed between the ground side electrode component 2A and the electrode component installation table 33, there is a possibility that anomalous discharge occurs in the gap.

In order to suppress the occurrence of anomalous discharge, it is necessary to make the dimensional tolerance and the geometrical tolerance considerably strict to improve the dimensional accuracy of the ground side electrode component 2A and the electrode component installation table 33. However, there is a risk in the dielectric electrode 211 constituting the ground side electrode component 2A that processing at a desired tolerance level may be difficult or processing costs may increase.

(Fifth Problem)

The basic art has too many O-rings 70 as a whole. Increasing the number of O-rings 70 has the problem of not only causing an increase in fastening force, but also increasing the risk of leakage.

(Sixth Problem)

In the basic art, the O-ring 70 is provided at a location where the temperature becomes high, such as near the discharge space 66 or the bottom surface 34b of the hollow space part of the metal housing 34. In general, it is known that, even when the temperature of the O-ring 70 is equal to or lower than the upper temperature limit of the heat resistance, in a region close to the temperature, evaporation of a constituent substance occurs and a minute leak occurs.

(Seventh Problem)

The housing contact space R34 is a closed space whose periphery is sealed by the O-ring 70. At the time of assembling, the housing contact space R34 is at the atmospheric pressure because it is already a closed space, and when the temperature of the metal housing 34 rises due to the start of operation, due to its heat conduction, the temperature of the gas in the housing contact space R34 rises. However, since the housing contact space R34 is a closed space, there is no escape area for gas, which causes an increase in pressure. As a result, there is a concern that this may be an excessive load source to the metal housing 34, the cover 32, or the like.

(Eighth Problem)

As illustrated in FIGS. 5A to 5D, the wedge-shaped stepped part 51, the straight stepped parts 52A and 52B, and the spacer 37 are provided for defining the gap length of the discharge space 66 between the high-voltage side electrode component 1A and the ground side electrode component 2A.

Since the wedge-shaped stepped part 51 and the straight stepped parts 52A and 52B are the same components on the ground side electrode component 2A, the heights are easily aligned. On the other hand, the spacer 37 is a component separate from those, and the dimensional tolerance and the geometrical tolerance of both the ground side electrode component 2A and the spacer 37 need to be strict in order to match the heights.

However, even if the dimensional tolerance and the geometrical tolerance are strict, the formation heights do not completely coincide with each other between the wedge-shaped stepped part 51 and the straight stepped parts 52A and 52B, and the spacer 37, and leakage of gas that is not originally desired occurs from the gap created by the difference thereof.

The spacer 37 has a plurality of through-holes 37h. However, a wide variety of risks can be considered, such as an increase in the number of processing steps due to holes being fine, biasing of the gas flow due to the variation of the hole dimensional tolerance, and the possibility of generating dust of particles due to the hole surface being unable to be smoothed.

Furthermore, since the spacer 37 is provided to receive a load on the O-ring 70 that seals the cover 32 and the high-voltage side electrode component 1A, it is difficult to omit the spacer 37.

As described above, the basic art illustrated in FIGS. 4 and 5A to 5D has the above-described effects, but has the above-described first to eighth problems and has room for improvement. The embodiment described below solves the problems of the basic art.

Embodiment

Figure 2:
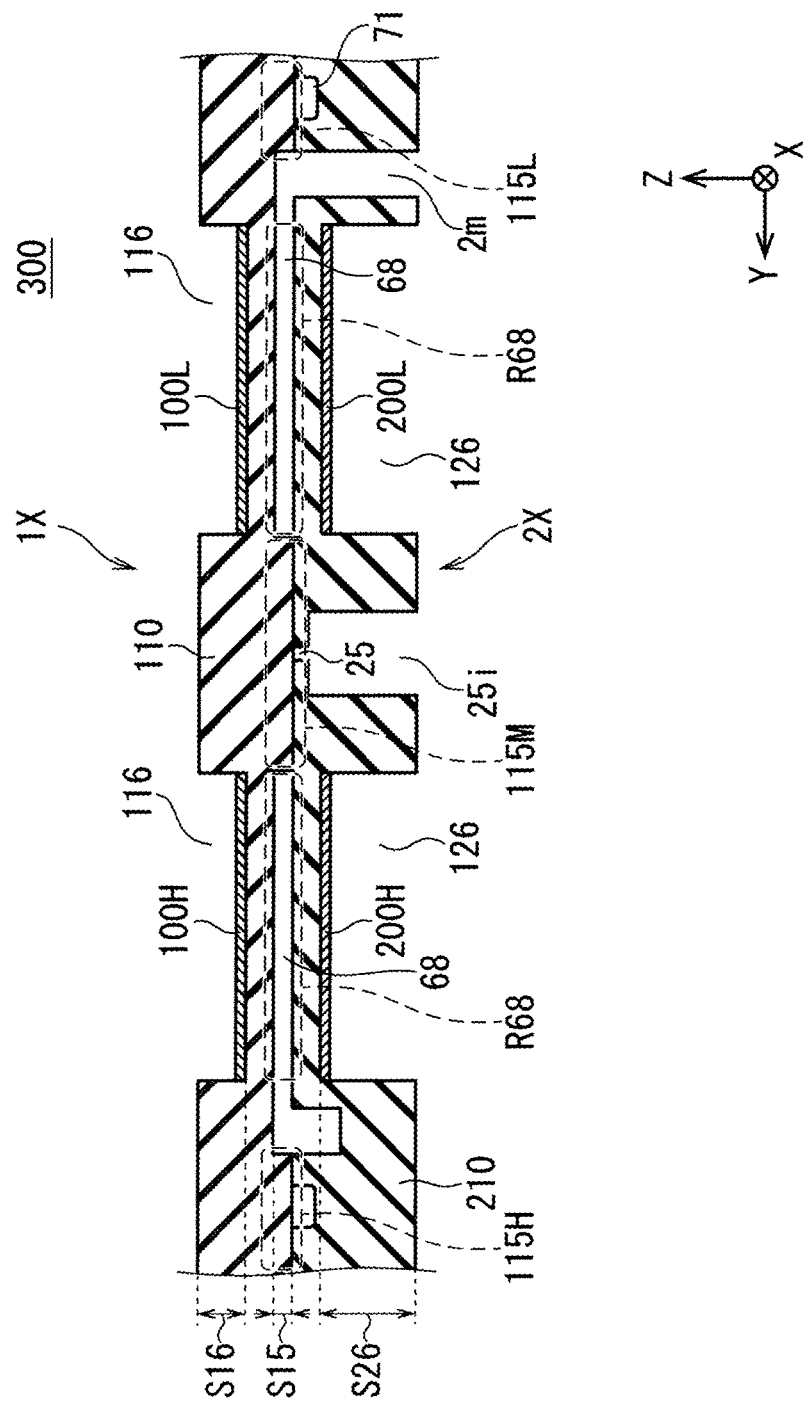
FIG. 2 is an explanatory diagram illustrating a cross-sectional configuration of the active gas generation electrode group illustrated in FIG. 1.

FIG. 1 is an explanatory diagram schematically illustrating a cross-sectional structure of an active gas generation apparatus according to an embodiment of the present invention. FIG. 2 is an explanatory diagram illustrating a cross-sectional configuration of an active gas generation electrode group 300. FIGS. 3A to 3D are explanatory diagrams illustrating a main configuration part of the active gas generation apparatus according to the embodiment in a disassembled state. Note that FIGS. 1 to 3D each show an XYZ orthogonal coordinate system.

Figure 3A:
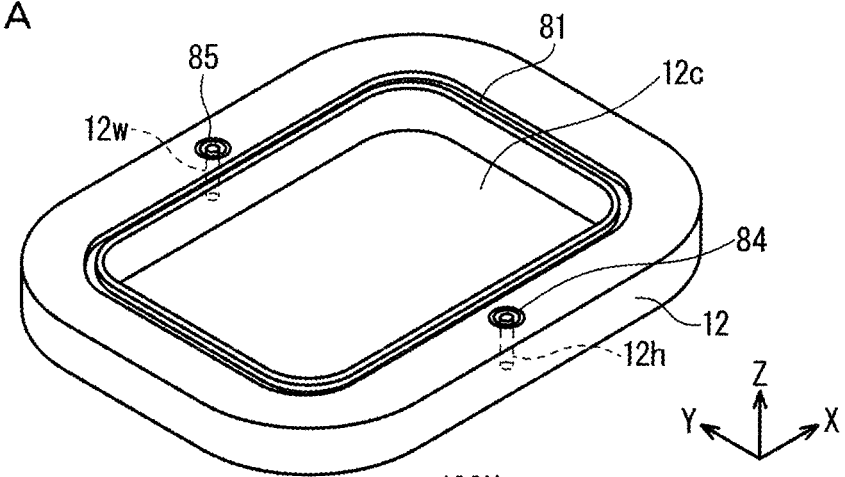
FIGS. 3A to 3D are explanatory diagrams illustrating a main configuration part of the active gas generation apparatus according to the embodiment in a disassembled state.
Figure 3B:
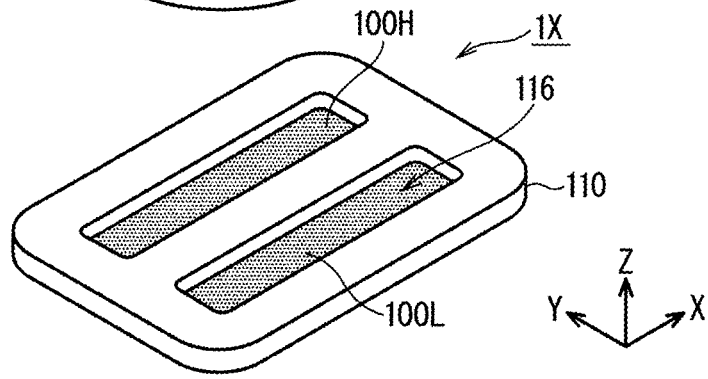
Figure 3C:
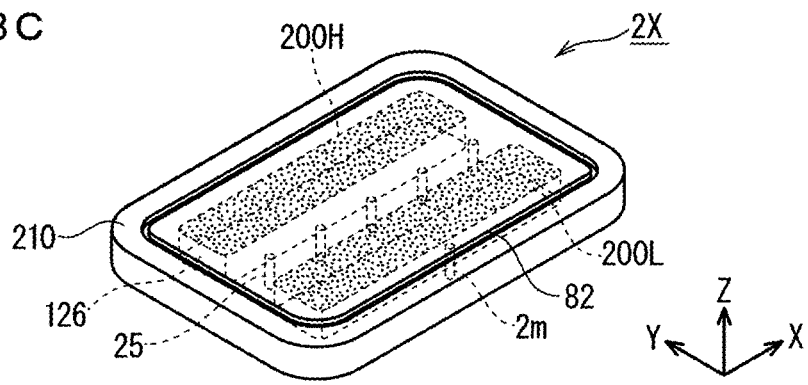

As illustrated in FIG. 2, FIG. 3B and FIG. 3C, the active gas generation electrode group 300 includes a high-voltage side electrode component 1X (first electrode component) and a ground side electrode component 2X (second electrode component) provided below the high-voltage side electrode component 1X.

A dielectric electrode 110 (first dielectric electrode) of the high-voltage side electrode component 1X and a dielectric electrode 210 (second dielectric electrode) of the ground side electrode component 2X has a rectangular flat plate structure having a longitudinal direction along the X direction and a transverse direction along the Y direction. The dielectric electrode 110 and the dielectric electrode 210 are made of, for example, ceramic.

As illustrated in FIGS. 2 and 3B, when viewed in plan view, a pair of discharge recesses 116 are provided along the X direction, sandwiching the central region of the dielectric electrode 110, facing each other, and recessed downward (−Z direction) from the upper surface of the dielectric electrode 110. Then, metal electrodes 100H and 100L (first metal electrodes) are provided on the recessed surfaces of the pair of discharge recesses 116.

As described above, the metal electrodes 100H and 100L, which are the first metal electrodes, are formed on the upper surface of the dielectric electrode 110, which is the first dielectric electrode (the recessed surface of the discharge recess 116), and have substantially rectangular shapes when viewed in plan view, and have a longitudinal direction along the X direction, and a direction in which they face each other, along the Y direction orthogonal to the X direction.

The metal electrodes 100H and 100L can be formed by performing a metallizing process on the upper surface of the dielectric electrode 110.

As illustrated in FIGS. 2 and 3C, a plurality of gas ejection holes 25 are provided in the central region of the dielectric electrode 210 along the X direction. Each of the plurality of gas ejection holes 25 is provided so as to penetrate from the upper surface to the lower surface of the dielectric electrode 210, and a plurality of gas passing ports 25i are provided below the plurality of gas ejection holes 25, respectively. The gas ejection hole 25 and the gas passing port 25i are formed in a columnar shape, and the gas passing port 25i has a bottom surface wider than the gas ejection hole 25. Note that in FIG. 3C, illustration of the gas passing port 25i is omitted, and only the gas ejection hole 25 is illustrated as a representative.

As illustrated in FIGS. 2 and 3C, when viewed in plan view, a pair of discharge recesses 126 are provided along the X direction, sandwiching the central region of the dielectric electrode 210, facing each other, and recessed upward (+Z direction) from the lower surface of the dielectric electrode 210. Metal electrodes 200H and 200L (second metal electrodes) are provided on the recessed surfaces of the pair of discharge recesses 126. Note that an O-ring groove 82 for forming a ring 71 is provided in the upper surface of the dielectric electrode 210 so as to surround the metal electrodes 200H and 200L in plan view.

As described above, the metal electrodes 200H and 200L, which are the second metal electrodes, are formed on the lower surface of the dielectric electrode 210, which is the second dielectric electrode (the recessed surface of the discharge recess 126), and have substantially rectangular shapes when viewed in plan view, and have a longitudinal direction along the X direction, and a direction in which they face each other, along the Y direction orthogonal to the X direction.

Note that the metal electrodes 200H and 200L are formed by performing a metallizing process on the lower surface of the dielectric electrode 210.

The active gas generation electrode group 300 is provided in such a manner that the ground side electrode component 2X supports the high-voltage side electrode component 1X.

Note that, when the active gas generation electrode group 300 is assembled, the high-voltage side electrode component 1X is stacked and combined on the ground side electrode component 2X while the central region of the dielectric electrode 110 in the high-voltage side electrode component 1X and the central region of the dielectric electrode 210 in the ground side electrode component 2X are positioned to overlap with each other in plan view. This can finally complete the active gas generation electrode group 300. After that, the dielectric electrode 110 of the high-voltage side electrode component 1X and the dielectric electrode 210 of the ground side electrode component 2X are fastened and integrated by a fastening mechanism (not illustrated) such as a bolt.

The discharge space 68 is defined to be a space present in a discharge space formation region R68 in which the metal electrodes 100H and 100L overlap with the metal electrodes 200H and 200L in plan view in a dielectric space across which the dielectric electrode 110 and the dielectric electrode 210 included in the active gas generation electrode group 300 face each other. Therefore, the discharge recess 116 is provided in the discharge space formation region R68 of the dielectric electrode 110, and the discharge recess 126 is provided in the discharge space formation region R68 of the dielectric electrode 210.

As illustrated in FIG. 2, the dielectric electrode 110 has stepped parts 115H, 115M and 115L having a lower surface projecting downward (−Z direction) by an amount of a formation depth S15 as compared to the discharge space formation region R68, in the discharge space outside region being a region other than the discharge space formation region R68, and the gap length of the discharge space 68 is defined by the formation depth S15 of the stepped parts 115H, 115M and 115L.

In addition, the strength of the dielectric electrode 110 of the high-voltage side electrode component 1X is maintained by making the thickness of the discharge space formation region R68 relatively thin and making the discharge space outside region relatively thick.

That is, as illustrated in FIG. 2, assuming that the depth of the downward recess of the discharge recess 116 is S16, in the dielectric electrode 110, the discharge space formation region R68 can be formed as thin as about "S16+S15" as compared to the discharge space outside region.

The strength of the dielectric electrode 210 of the ground side electrode component 2X is maintained by making the thickness of the discharge space formation region R68 relatively thin and making the discharge space outside region relatively thick.

That is, as illustrated in FIG. 2, assuming that the depth of the upward recess of the discharge recess 126 is S26, in the dielectric electrode 120, the discharge space formation region R68 can be formed as thin as about "S26" as compared to the discharge space outside region. Note that the upper surface of the dielectric electrode 210 is a flat surface without generating a step between the discharge space formation region R68 and the discharge space outside region.

As described above, since the dielectric electrode 210 of the ground side electrode component 2X has relatively high strength, the high-voltage side electrode component 1X can be supported by the ground side electrode component 2X with high stability.

The metal electrodes 100H and 100L and the metal electrodes 200H and 200L are connected with a (high-voltage) high frequency power source 5 (alternating-current power source unit). Specifically, the metal electrodes 200H and 200L of the ground side electrode component 2X are grounded through a cooling table 13 and a metal component (not illustrated), and in the present embodiment, an alternating-current voltage having a zero peak value fixed to 2 kV to 10 kV and a frequency set to be 10 kHz to 100 kHz is applied between each of the metal electrodes 100H and 100L and the corresponding one of the metal electrodes 200H and 200L from the high frequency power source 5.

Then, as illustrated in FIG. 1, in the active gas generation apparatus according to the present embodiment, the active gas generation electrode group 300 having the above-described configuration is housed in the metal housing 14 by using the cover 11, a cover 12, and the cooling table 13.

As described above, the high frequency power source 5 configured to apply alternating-current voltage so that the high-voltage side electrode component 1X is at a high voltage relative to the active gas generation electrode group 300 is provided. Through the alternating-current voltage application by the high frequency power source 5, a discharge phenomenon (dielectric barrier discharge) occurs in the discharge space 68 between the high-voltage side electrode component 1X and the ground side electrode component 2X, and active gas obtained by activating the material gas supplied to the discharge space 68 is ejected downward through the plurality of gas ejection holes 25 provided in the ground side electrode component 2X.

The combined structure of the covers 11 and 12, which are the first auxiliary members, and the cooling table 13, which is the second auxiliary member are provided so as to form an alternating-current voltage application space R11 between themselves and the active gas generation electrode group 300, having a part above the high-voltage side electrode component 1X as a main region.

That is, as illustrated in FIGS. 1 and 3A, the cover 12 is provided so as to surround the periphery of the active gas generation electrode group 300, and provided so that the cover 11 arranged on the cover 12 is positioned above the high-voltage side electrode component 1X, and as a result, the side surface and the upper surface of the active gas generation electrode group 300 are surrounded by the cover 11 and the cover 12. On the other hand, the cooling table 13 having a main surface 13b on which the ground side electrode component 2X of the active gas generation electrode group 300 is arranged (see FIG. 3D). As a result, the alternating-current voltage application space R11 can be formed by the cover 11, the cover 12, and the cooling table 13.

Note that, since the dielectric electrode 210 in the ground side electrode component 2X is formed such that the above-described discharge space outside region is formed to be thicker than the discharge space formation region R68, the active gas generation electrode group 300 can be mounted on the cooling table 13 from the ground side electrode component 2X side in a manner where only the dielectric electrode 210 contacts the main surface 13b, and the metal electrodes 200H and 200L do not contact the main surface 13b.

Figure 3D:
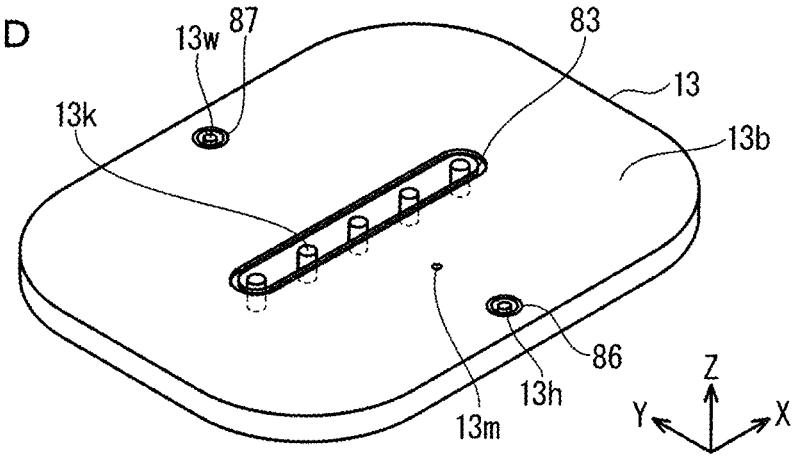

Furthermore, as illustrated in FIG. 1 and FIG. 3D, the cooling table 13 includes a plurality of active gas discharge ports 13k through which the active gas ejected from the plurality of gas ejection holes 25 and the plurality of gas passing ports 25i passes and is guided downward. The plurality of active gas discharge ports 13k are disposed to coincide with the plurality of gas passing ports 25i in plan view, and the active gas discharge port 13k functions as a gas discharge port for an auxiliary member through which the active gas ejected from corresponding gas election hole 25 and gas passing ports 25i passes.

Note that, in the main surface 13b of the cooling table 13, an O-ring groove 83 for forming the ring 71 is provided so as to surround the plurality of active gas discharge ports 13k in plan view, an O-ring groove 86 for forming an O-ring 72 is provided in the periphery of a material gas flow path 13h, and an O-ring groove 87 for forming an O-ring 72 is provided in the periphery of a cooling water path 13w.

As illustrated in FIG. 3A, the cover 12 constituting a part of the first auxiliary member is formed in a rectangular annular shape in plan view and disposed on the cooling table 13 so as to surround the entire active gas generation electrode group 300.

On the other hand, the formation area of the main surface 13b of the cooling table 13 is set to be larger than the active gas generation electrode group 300 in plan view and substantially the same as the outer peripheral area of the cover 12, and the active gas generation electrode group 300 and the cover 12 can be disposed on the main surface 13b.

In addition, as illustrated in FIG. 1 and FIG. 3A, the cover 12 includes a columnar material gas flow path 12h penetrating through the cover 12 in the vertical direction (Z direction). The material gas flow path 13h of the cooling table 13 is positioned below the material gas flow path 12h.

As illustrated in FIGS. 1 and 3D, the material gas flow path 13h is formed to extend in the vertical direction (−Z direction) from the surface of the cover 12, then bend halfway, and extend in the horizontal direction (+Y direction). In addition, a material gas flow path 13m connected to the material gas flow path 13h is formed to extend from an end of the material gas flow path 13h along the vertical direction (+Z direction) to the main surface 13b.

As illustrated in FIG. 1, a material gas flow path 2m provided on the dielectric electrode 210 of the ground side electrode component 2X is positioned above the material gas flow path 13m. As illustrated in FIG. 2, the material gas flow path 2m is provided in the dielectric electrode 210 so as to be connected to the discharge space 68.

As illustrated in FIGS. 1 and 3A, the cover 12 further includes a cylindrical cooling water path 12w penetrating the cover 12 in the vertical direction (Z direction). A cooling water path 13w of the cooling table 13 is positioned below the cooling water path 12w.

Furthermore, as illustrated in FIG. 3A, in the upper surface of the cover 12, an O-ring groove 81 for forming the O-ring 71 is provided in a region along an outer periphery of the hollow region 12c, an O-ring groove 84 for forming an O-ring 72 is provided in the periphery of the material gas flow path 12h, and an O-ring groove 85 for forming the O-ring 72 is provided in the periphery of the cooling water path 12w.

As illustrated in FIGS. 1 and 3D, the cooling water path 13w extends in the vertical direction (−Z direction) from the surface of the cooling table 13, bends halfway, and extends in the horizontal direction. Although the cooling water path 13w formed to extend in the horizontal direction is only partially illustrated in FIG. 1, actually, the cooling water path 13w is provided so that the cooling water can circulate between the cooling water path 13w and the outside over the entire cooling table 13.

In addition, the cover 11 is disposed on the cover 12. The cover 11 has a lower part formed in a rectangular annular shape identical to that of the cover 12 in plan view, and an upper part formed in a rectangular shape in plan view, an end part of the upper part being disposed on the upper surface of the metal housing 14. The inner peripheral region of the cover 11 and the inner peripheral region (hollow region 12c) of the cover 12 form an alternating-current voltage application space R11 surrounding the upper surface and side surfaces of the active gas generation electrode group 300.

As described above, by completely surrounding the active gas generation electrode group 300 by the cover 11, the cover 12, and the cooling table 13, the alternating-current voltage application space R11 that is a closed space is formed mainly above the high-voltage side electrode component ix.

Note that the part between the cover 11 and the cover 12, and the part between the cover 12 and the cooling table 13 are fixed using a fastening mechanism such as a bolt not illustrated, and the cover 11, the cover 12, and the cooling table 13 are integrally coupled.

The upper part of the cover 11 and the metal housing 14 are fastened by the fastening mechanism 76 only on the upper surface of the metal housing 14 with respect to the cover 11, the cover 12 and the cooling table 13 having an integral structure.

As illustrated in FIG. 1, the cover 11 includes a vertically penetrating material gas flow path 11h formed in a cylindrical shape, and part of the material gas flow path 12h is positioned below the material gas flow path 11h.

In addition, as illustrated in FIG. 1, the cover 11 has a cooling water path 11w penetrating in a vertical direction, the cooling water path 11w is formed in a columnar shape, and the cooling water path 12w is positioned below the cooling water path 11w.

In addition, the cover 11 includes, at the upper part, a vertically penetrating purge gas supply port 11p as a second gas supply port for purge gas as second gas other than the material gas, and a vertically penetrating purge gas discharge port 11e as a second gas discharge port. The purge gas supply port 11p and the purge gas discharge port 11e are each formed in a cylindrical shape. The purge gas supply port 11p and the purge gas discharge port 11e are each provided so that a lower part thereof reaches the alternating-current voltage application space R11. The purge gas supply port 11p and the purge gas discharge port 11e are provided independently from the material gas flow path 11h and the cooling water path 11w to avoid mixture of the purge gas and the material gas and the cooling water. The purge gas supplied through the purge gas supply port 11p is nitrogen or inert gas. The purge gas supply port 11p and the purge gas discharge port 11e are also formed independently from the discharge space 68 and a housing contact space R14.

As described above, the lower part of the cover 11 and the whole of the cover 12 are both formed in a rectangular annular shape in plan view, and the active gas generation electrode group 300 is mounted on the cooling table 13 so that the active gas generation electrode group 300 is positioned in the hollow region 12c of the cover 12. Thus, the alternating-current voltage application space R11 is a closed space formed in the cover 11, the cover 12, and the cooling table 13, and is an independent space completely separated from other spaces.

In addition, by passing through the material gas flow path 11h, the material gas flow path 12h, the material gas flow path 13h, the material gas flow path 13m, and the material gas flow path 2m, a material gas flow path connected to the discharge space 68 from the outside above the material gas flow path 11h is formed. At this time, the material gas flow paths 11h, 12h, 13h, 13m, and 2m are provided independently of the alternating-current voltage application space R11.

Therefore, by passing through the material gas flow paths 11h to 13h, 13m, and 2m, the material gas flow path for leading from above the material gas flow path 11h to the discharge space 68 is formed independently of the alternating-current voltage application space R11.

As a result, the alternating-current voltage application space R11 and the discharge space 68 are not spatially connected with each other through the material gas supply path, and thus the alternating-current voltage application space R11 is formed completely separated from the discharge space 68, and gas flow can be completely separated between the alternating-current voltage application space R11 and the discharge space 68.

In addition, by passing the cooling water path 11w, the cooling water path 12w, and the cooling water path 13w, a cooling water circulation path for cooling the cooling table 13 from the outside above the cover 11 is formed. At this time, the cooling water paths 11w, 12w, and 13w are provided independently of the alternating-current voltage application space R11 and the discharge space 68.

Therefore, the cooling water circulation path, which is formed of the cooling water paths 11w to 13w and provided between above the cooling water path 11w and the inside of the cooling table 13, does not adversely affect the alternating-current voltage application space R11 and the discharge space 68.

Note that the cover 11, the cover 12, and the cooling table 13 are all made of a metal material.

The metal housing 14 houses, in an internal hollow space part, all of the active gas generation electrode group 300 (the high-voltage side electrode component 1X and the ground side electrode component 2X), the cover 12, and the cooling table 13, and the lower part of the cover 11.

The upper part of the cover 11 and the metal housing are fastened by the fastening mechanism 76 only on the upper surface of the metal housing 14. Therefore, the housing contact space R14 can be formed in the hollow space part of the metal housing 14 without causing contact of the lower portion of the cover 11 and the side surfaces of the cover 12 and the cooling table 13 with the side surface 14d of the metal housing 14, and contact of the bottom surface of the cooling table 13 with the bottom surface 14b of the metal housing 14.

That is, the housing contact space R14 is the space including the side space provided between the side surface 14d of the hollow space part of the metal housing 14 and the cooling stand 13, the cover 12 and the lower part of the cover 11, and the bottom space provided between the bottom surface 14b of the hollow space part of the metal housing 14 and the cooling table 1.

In this manner, the housing contact space R14 is provided between the metal housing 14 and the outside of the cover 11, the cover 12, and the cooling table 13. The housing contact space R14 is provided mainly for insulating the cover 11, the cover 12, and the cooling table 13 from the metal housing 14.

Further, the cooling table 13 is positioned above the bottom surface 14b of the hollow space part of the metal housing 14 with the housing contact space R14 therebetween, and an active gas discharge port 14k (housing gas discharge port) is positioned below the active gas discharge port 13k via the housing contact space R14.

With this configuration, the active gas ejected from the gas ejection holes 25 is ejected, along gas flow in the vertical direction (−Z direction), to an external processing chamber provided below or the like through the gas passing ports 25i, the active gas discharge ports 13k, the housing contact space R14, and the active gas discharge port 14k.

As described above, the alternating-current voltage application space R11 is configured to be an internal space completely independent of other spaces by the integrated cover 11, cover 12, and cooling table 13. With this configuration, the housing contact space R14 is separated from the alternating-current voltage application space R11.

In addition, since the material gas flow paths 11h, 12h and the like for the material gas supply path are provided independently from the housing contact space R14, gas flow in the above-described material gas supply path reaching the discharge space 68 is completely separated from gas flow in the housing contact space R14.

In this manner, the alternating-current voltage application space R11, and the material gas supply path including the material gas flow paths 11h and 12h are provided independently from the housing contact space R14 so that gas flow therein is separated from gas flow in the housing contact space R14. The cooling water circulation path including the cooling water paths 11w and 12w is provided independently of the housing contact space R14, similarly to the material gas supply path.

At the contact surface between the cover 11 and the cover 12, the O-ring 72 is provided in the periphery of the material gas flow paths 11h and 12h, the O-ring 72 is provided in the periphery of the cooling water paths 11w and 12w, and the O-ring 71 is provided so as to surround the active gas generation electrode group 300.

Similarly, at the contact surface between the cover 12 and the cooling table 13, the O-ring 72 is provided in the periphery of the material gas flow paths 12h and 13h, the O-ring 72 is provided in the periphery of the cooling water paths 12w and 13w, and the O-ring 71 is provided so as to surround the active gas generation electrode group 300.

The O-ring 72 described above increases the degree of sealing of the material gas supply path or the cooling water circulation path from other spaces. The O-ring 71 described above increases the degree of sealing of the alternating-current voltage application space R11 from other spaces.

The O-ring 72 is provided in the periphery of the active gas discharge port 13k on the contact surface between the dielectric electrode 210 of the ground side electrode component 2X and the cooling table 13. The O-ring 72 increases the degree of sealing with the active gas discharge port 13k. In FIG. 1, each O-ring 71 or each O-ring 72 is illustrated with a small white spot.

(Effect and the Like)

In the active gas generation apparatus according to the present embodiment, the alternating-current voltage application space R11 is separated from the discharge space 68, and the cover 11, the cover 12, and the cooling table 13 that are the first and second auxiliary members include the material gas flow paths 11*h*, 12*h*, 13*h* and 13*m* for the material gas supply path that guide externally supplied material gas to the discharge space 68 independently from the alternating-current voltage application space R11, thereby separating gas flow in the discharge space 68 from gas flow in the alternating-current voltage application space R11.

Therefore, the active gas generation apparatus of the present embodiment can reliably avoid a mixing phenomenon (corresponding to the "first mixing phenomenon" of the basic art) in which an evaporation material, such as the material of the high-voltage side electrode component 1X and the ground side electrode component 2X, generated when anomalous discharge occurs in the alternating-current voltage application space R11 is mixed into the discharge space 68 directly or through the material gas supply path.

As a result, the active gas generation apparatus of the present embodiment can reliably avoid the mixing phenomenon described above and discharge high quality active gas to the outside.

The active gas generation apparatus of the present embodiment has the following features (1) to (5).

Feature (1) . . . The active gas generation electrode group 300 is formed in such a manner that the ground side electrode component 2X supports the high-voltage side electrode component 1X.

Feature (2) . . . The stepped parts 115H, 115M, 115L are provided in the above discharge space outside region of the dielectric electrode 110 in the high-voltage side electrode component 1X, and project downward, and by the formation height S15 of these stepped parts 115H, 115M, 115L, the gap length of the discharge space 68 is defined.

Feature (3) . . . The dielectric electrode 110 of the high-voltage side electrode component 1X and the dielectric electrode 210 of the ground side electrode component 2X are formed to have the thickness of the discharge space formation region R68 relatively thin and the thickness of the discharge space outside region relatively thick.

Feature (4) . . . The metal housing 14 is fastened to the upper part of the cover 11 only on the upper surface, the housing contact space R14 is formed in the hollow space part of the metal housing 14 without contacting with the side surfaces of the cover 11, the cover 12, and the cooling table 13 and the bottom surface of the cooling table 13.

Feature (5) . . . The cover 11, the cover 12, and the cooling table 13 are all made of a metal material.

The active gas generation apparatus of the present embodiment has the above feature (1), so that the alignment between the high-voltage side electrode component 1X and the ground side electrode component 2X is relatively easy, and a structure is provided in which positional shift is unlikely to occur between the high-voltage side electrode component 1X and the ground side electrode component 2X. Thus, it is possible to reduce a possibility that an anomalous discharge occurs in a gap caused by the positional shift.

That is, since the ground side electrode component 2X functions as an installation table for the high-voltage side electrode component 1X, strict alignment between the cooling table 13 and the active gas generation electrode group 300 is not required, and therefore, excessively high processing accuracy is not necessary, and the strength of the active gas generation electrode group 300 can be increased. Therefore, the fourth problem of the basic art can be solved.

Since the active gas generation apparatus of the present embodiment has the above-mentioned feature (2), the gap length of the discharge space 68 can be set with high accuracy, and further, other parts such as a spacer for forming the gap length are unnecessary, so that product costs can be reduced.

That is, the gap length of the discharge space 68 is defined only by the formation height S15 of the stepped parts 15H, 115M, 115L of the high-voltage side electrode component 1X, which is one component. Since the formation heights of the stepped parts 15H, 115M, 115L can be relatively easily matched with each other at the formation height S15 with high accuracy, the accuracy of the gap length of the discharge space 68 can be improved.

The active gas generation electrode group 300 only needs to be disposed on the cooling table 13, and since the active gas generation electrode group 300 has no contact relationship with the cover 12, it is possible to eliminate the need to provide an O-ring for sealing the active gas generation electrode group 300 and the cover 12.

In the present embodiment, since a component for receiving a load such as the spacer 37 of the basic art is not required, the eighth problem of the basic art can be solved.

The active gas generation apparatus of the present embodiment has the above feature (3), so that, in each of the dielectric electrodes 110 and 210, the thickness of the discharge space formation region R68 is sufficiently reduced, and an increase in the applied voltage for causing a discharge phenomenon in the discharge space 68 of the active gas generation electrode group 300 can be avoided to reduce the possibility of occurrence of anomalous discharge.

By increasing the thickness of the discharge space outside region sufficiently in each of the high-voltage side electrode component 1X and the ground side electrode component 2X, the strength of each of the high-voltage side electrode component 1X and the ground side electrode component 2X can be improved.

As described above, in the present embodiment, the third problem of the basic art can be solved by sufficiently increasing the thickness of the discharge space outside region in each of the high-voltage side electrode component 1X and the ground side electrode component 2X to increase the strength.

Since the active gas generation apparatus of the present embodiment has the above feature (4), fastening between the metal housing 14 and the cover 11 constituting the first auxiliary member can be completed at one place on the upper surface of the metal housing 14, so that the design shape can have room.

Therefore, the active gas generation apparatus of the embodiment can solve the first problem of the basic art.

Since the active gas generation apparatus of the present embodiment has the above feature (5), dielectric breakdown due to gas present in the housing contact space R14 provided between the metal housing 14, and the cover 11, the cover 12, and the cooling table 13 can be effectively prevented.

That is, since the alternating-current voltage application space R11 is completely covered by the metal cover 11, cover 12, and cooling table 13, the high electric field generated in the alternating-current voltage application space R11 does not affect the external housing contact space R14. Therefore, anomalous discharge does not occur in the housing contact space R14.

As described above, the sealing between the cover 11 and the metal housing 14 is provided only at one location on the upper surface of the metal housing 14, and the housing contact space R14 is provided also between the bottom surface of the cooling table 13 and the metal housing 14.

Since the housing contact space R14 is connected to the active gas discharge port 14k below the bottom surface of the cooling table 13, the housing contact space R14 is an open space open to the outside. Therefore, since the gas does not increase in pressure in the housing contact space R14, the seventh problem of the basic art can be solved.

In the basic art, it is necessary to provide sealing between the electrode component installation table 33 and the metal housing 34 on the assumption that anomalous discharge would occur in the housing contact space R34. However, in the structure of the present embodiment, since the active gas generation electrode group 300 is provided in a closed space formed by all grounded metal parts (the cover 11, the cover 12, and the cooling table 13), a structure is provided in which anomalous discharge does not occur in the alternating-current voltage application space R11 present in the closed space.

The O-rings 71 are provided between the cover 11 and the cover 12, between the cover 12 and the cooling table 13, and between the high-voltage side electrode component 1X and the ground side electrode component 2X in the active gas generation electrode group 300, respectively.

Therefore, although not illustrated in FIG. 1, it is desirable that reliable sealing processing is performed in the periphery of each O-ring 71 between the metal housing 14 and the cover 11, between the cover 11 and the cover 12, between the cover 12 and the cooling table 13, and between the high-voltage side electrode component 1X and the ground side electrode component 2X using a fastening mechanism such as a bolt, and fastening force of each fastening mechanism is minimized to suppress occurrence of unnecessary bending stress or the like. With such a configuration, the active gas generation apparatus of the present embodiment can solve the second problem of the basic art.

The metal housing 14, the cover 11, the cover 12, and the cooling table 13 are made of a metal material, and each of the dielectric electrode 110 of the high-voltage side electrode component 1X and the dielectric electrode 210 of the ground side electrode component 2X has sufficiently thick film thickness of the discharge space outside region, and therefore, a fastening mechanism such as a bolt can be used for these components 1X, 2Y and 11 to 14 without any trouble.

Comparing the embodiment illustrated in FIGS. 1 to 3D with the basic art illustrated in FIGS. 4 and 5A to 5D, in the embodiment, the ground side electrode component 2X also has the function of the electrode component installation table 33, and therefore, there is no need to provide the O-ring 71 corresponding to the O-ring 70 for sealing between the cover 32 and the high-voltage side electrode component 1A, and the O-ring 70 for sealing between the electrode component installation table 33 and the ground side electrode component 2A, which are required in the basic art.

Therefore, since the number of O-rings 71 and 72 required in the present embodiment can be reduced from the number of O-rings 70 required in the basic art, the number of parts related to the O-ring can be reduced to reduce the number of sealing locations, and the fifth problem of the basic art can be solved.

In the active gas generation apparatus of the embodiment, since the cover 11, the cover 12, and the cooling table 13, which are the first and second auxiliary members, have the cooling water paths 11w, 12w, and 13w for the cooling water circulation path that lead the cooling water supplied from the outside to the cooling table 13, the active gas generation electrode group 300 can be cooled from the ground side electrode component 2X side to minimize the influence of thermal distortion.

As described above, the embodiment has a structure in which the cooling is performed by passing the cooling water inside the active gas generation apparatus. With the above structure of the embodiment, the O-rings 71 and 72 can be maintained at a temperature significantly lower than the upper temperature limit of heat resistance, and the sixth problem of the basic art can be solved.

On the other hand, although the metal housing 14 needs to be heated to 100° C. or higher, the housing contact space R14 is provided inside the hollow space part of the metal housing 14, the cover 11, the cover 12, the cooling table 13 and the metal housing 14 are not in contact with each other in the hollow space part of the metal housing 14, and the housing contact space R14 is a reduced pressure region of about 1 to 5 Torr. Thus, a structure is provided in which the heat conduction from the metal housing 14 to the active gas generation electrode group 300 is suppressed.

In addition, in the active gas generation apparatus according to the present embodiment, the purge gas as the second gas other than the material gas can be supplied into the alternating-current voltage application space R11 through the purge gas supply port 11p. Thus, any evaporation material generated when anomalous discharge occurs in the alternating-current voltage application space R11 can be removed to the outside through the purge gas discharge port 31e.

Since the above-described material gas supply path and the cooling water circulation path are provided independently from the alternating-current voltage application space R11, the material gas and the cooling water are not affected by the purge gas supply.

<Modification>

In the active gas generation apparatus of the present embodiment, the pressure in the discharge space 68 is substantially set to be a relatively low atmospheric pressure of 10 kPa to 30 kPa approximately. In this pressure setting, the material gas is, for example, gas containing nitrogen (100%).

In the discharge space 68 as a space in which a discharge D1 is generated to activate the material gas, the discharge desirably starts at a lower voltage. The discharge D1 is caused by insulation breakdown of the gas when the electric field intensity exceeds a particular value.

The electric field intensity that causes insulation breakdown is determined by the kind of the material gas and the pressure, and is lower at a lower pressure in the vicinity of atmospheric pressure. For this reason, the above-described pressure setting is applied to the discharge space 68.

On the other hand, it is desirable not to generate discharge as much as possible in the alternating-current voltage application space R11. The most reliable method of preventing anomalous discharge from being generated as unexpected discharge is to provide a sufficient insulation distance, but the distance is limited due to problems with the installation space of the active gas generation electrode group 300, and thus in the modification, the electric field intensity at insulation breakdown is increased by increasing the pressure. However, the pressure has an upper limit value substantially determined by the strength of components, and thus the pressure at the alternating-current voltage application space R11 is desirably 100 kPa to 300 kPa (absolute pressure) approximately.

In the structure described in the embodiment, the discharge space 68 and the alternating-current voltage application space R11 have a structure in which the gas layers are separated from each other. Therefore, by setting the pressure of the discharge space 68 lower than the pressure of the alternating-current voltage application space R11, the discharge D1 in the discharge space 68 is generated even at a lower applied voltage, and by setting the pressure of the alternating-current voltage application space R11 relatively high, it is possible to set a pressure suitable for each of the discharge space 68 and the alternating-current voltage application space R11, that is, to suppress discharge.

In this manner, the modification of the embodiment can set relatively low pressure in the discharge space 68 so that a discharge phenomenon occurs at a lower applied voltage, and can set relatively high pressure in the alternating-current voltage application space R11 so that no discharge phenomenon occurs.

The present invention is described above in detail, but the above description is exemplary in any aspect, and the present invention is not limited to the description. Numerous modifications not exemplarily described would be thought of without departing from the scope of the present invention.

The invention claimed is:

1. An active gas generation apparatus comprising active gas generation electrodes and an alternating-current power source, said active gas generation electrodes including a first electrode and a second electrode provided below said first electrode, said alternating-current power source being configured to apply alternating-current voltage to said first and second electrodes so that said first electrode is at a high voltage, said first electrode including a first dielectric film and a first metal electrode on an upper surface of said first dielectric film, said second electrode including a second dielectric film and a second metal electrode on a lower surface of said second dielectric film, a space in which said first and second metal electrodes overlap each other in plan view defining a discharge space, a material gas supply path to provide a material gas to the discharge space from an external material gas supply, wherein an application of said alternating-current voltage by said alternating-current power source causing a discharge phenomenon in said discharge space, with the material gas therein, to generate an active gas, said active gas being ejected through a gas ejection port in said second electrode, each of said first and second dielectric films overlap said discharge space and a discharge exclusion space that is other than said discharge space, and said active gas generation apparatus further comprising:
a first auxiliary member provided surrounding a side surface and an upper surface of said active gas generation electrodes; and
a second auxiliary member having a main surface of an upper part on which said active gas generation electrodes and said first auxiliary member are arranged,
an alternating-current voltage application space, separated from said discharge space, between said active gas generation electrodes and each of said first and second auxiliary members, said second auxiliary member including an auxiliary member gas discharge port through which active gas ejected from said gas ejection port passes, said first and second auxiliary members being integrally coupled, and said active gas generation apparatus further comprising:
a housing of metal including a hollow space that houses all of said active gas generation electrodes and said second auxiliary member and at least part of said first auxiliary member, said housing including a housing gas discharge port through which the active gas passing through said auxiliary member gas discharge port is discharged to outside of said active gas generation apparatus, and a housing contact space between said housing and each of said first and second auxiliary members, wherein said first and second auxiliary members form part of the material gas supply path, through which externally supplied material gas is guided to said discharge space, independently from said alternating-current voltage application space so that gas flow in said discharge space and gas flow in said alternating-current voltage application space are separated from each other, and said active gas generation apparatus has features (1) to (5) below:
(1) said second electrode supports said first electrode,
(2) said first dielectric film includes a stepped part projecting downward in said discharge exclusion space, and a gap length of said discharge space is defined by a height of said stepped part,
(3) a thickness of said discharge space is less than that of said discharge exclusion space,
(4) said housing is fastened to said first auxiliary member only in an upper surface outside the hollow space to form said housing contact space in the hollow space without contacting a side surface of said first auxiliary member and a bottom surface of said second auxiliary member, and
(5) all of said first and second auxiliary members are formed of metal material.

2. The active gas generation apparatus according to claim 1,
wherein said first and second auxiliary members include a cooling water path for a cooling water circulation path that guides cooling water supplied from outside of said active gas generation apparatus to said second auxiliary member.

3. The active gas generation apparatus according to claim 1,
wherein said first auxiliary member further includes a second gas supply port through which second gas other than the material gas is externally supplied to said alternating-current voltage application space, and said second gas supply port is provided independently from said material gas supply path.

4. The active gas generation apparatus according to claim 1,
wherein pressure in said alternating-current voltage application space is higher than pressure in said discharge space.

* * * * *